(12) United States Patent
Phanse et al.

(10) Patent No.: US 6,407,637 B1
(45) Date of Patent: Jun. 18, 2002

(54) DIFFERENTIAL CURRENT MIRROR AND METHOD

(75) Inventors: Abhijit M. Phanse, Santa Clara; Michael X. Maida, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/569,964

(22) Filed: May 12, 2000

(51) Int. Cl.[7] .............................................. H03F 3/45
(52) U.S. Cl. ...................................... 330/257; 330/258
(58) Field of Search ................................ 330/253, 257, 330/258

(56) References Cited

U.S. PATENT DOCUMENTS

| | | | | |
|---|---|---|---|---|
| 4,075,574 A | * | 2/1978 | Gilbert ........................ 330/257 |
| 4,288,707 A | * | 9/1981 | Katakura ..................... 330/257 |
| 5,053,650 A | * | 10/1991 | Ohkubo et al. ............. 307/270 |
| 5,343,163 A | * | 8/1994 | Linder et al. ................ 330/252 |
| 5,381,114 A | * | 1/1995 | Pena-Finol et al. ......... 330/257 |
| 5,726,599 A | * | 3/1998 | Genest ........................ 330/294 |
| 5,986,501 A | * | 11/1999 | Rafati et al. ................ 330/254 |
| 6,121,913 A | * | 9/2000 | Glass et al. ................. 341/159 |
| 6,127,891 A | * | 10/2000 | Eschauzier et al. ......... 330/255 |

* cited by examiner

*Primary Examiner*—Robert Pascal
*Assistant Examiner*—Khanh Van Nguyen
(74) *Attorney, Agent, or Firm*—John L. Maxin

(57) ABSTRACT

There is disclosed a differential current mirror system and method for providing differential output current signals that are proportional to differential input current signals in which common mode current signals are rejected. The system comprises a pair of diode connected transistors and a differential amplifier. The pair of diode connected transistors comprises a first and second transistor coupled together. The differential amplifier comprises a third and fourth transistor coupled together in a differential amplifier configuration. The gate of the third transistor receives a first input current signal from the drain of the first transistor and the gate of the fourth transistor receives a second input current signal from the drain of the second transistor.

9 Claims, 3 Drawing Sheets

DIFFERENTIAL CURRENT MIRROR AND METHOD

CROSS-REFERENCE TO RELATED APPLICATIONS

The present invention is related to those disclosed in the following U.S. patent applications:

1. Ser. No. 09/570,082 filed May 12, 2000, entitled "SYSTEM AND METHOD FOR CURRENT SPLITTING FOR VARIABLE GAIN CONTROL;"
2. Ser. No. 09/569,958 filed May 12, 2000, entitled "DIFFERENTIAL CURRENT MIRROR SYSTEM AND METHOD;"
3. Ser. No. 09/570,330 filed May 12, 2000, entitled "ADAPTIVE EQUALIZER FILTER WITH VARIABLE GAIN CONTROL."

The above applications are commonly assigned to the assignee of the present invention. The disclosures of these related patent applications are hereby incorporated by reference for all purposes as if fully set forth herein.

TECHNICAL FIELD OF THE INVENTION

The present invention is generally directed to electronic control circuitry and, more specifically, to a differential current mirror system and method that is capable of rejecting common mode signals.

BACKGROUND OF THE INVENTION

Current mirrors are commonly used as electronic control circuits in integrated circuits. When a reference current is provided as an input to a current mirror, the current mirror provides an output current that is identical (or proportional) to the reference current. The term "current mirror" reflects the fact that the output current is a "mirror image" of the input reference current.

The difference between two current input signals is referred to as the differential mode of the two current input signals. The average value of two current input signals is referred to as the common mode of the two current input signals. In many applications input current signals may be represented as a linear combination of a differential mode component and a common mode component of the current input signal. It is often desirable to amplify the differential mode component by a large gain factor while minimizing the amplification factor of the common mode component. Minimizing the amplification factor of the common mode component is referred to as "rejecting" the common mode component.

Prior art differential current mirrors are capable of providing two output currents that are identical (or proportional) to two input reference currents. However, prior art differential current mirrors are not capable of rejecting the common mode component of input current signals.

There is therefore a need in the art for a differential current mirror and method that is capable of rejecting common mode input current signals.

SUMMARY OF THE INVENTION

To address the above-discussed deficiencies of the prior art, it is a primary object of the present invention to provide a differential current mirror system and method for providing differential output current signals in which common mode current signals are rejected.

The present invention comprises a pair of diode connected transistors and a differential amplifier. In an advantageous embodiment of the present invention, the pair of diode connected transistors and the differential amplifier comprise MOSFET transistors. The pair of diode connected transistors comprise a first transistor and a second transistor coupled together. The differential amplifier comprises a third transistor and a fourth transistor in which the gate of the third transistor receives a first input voltage signal from the drain of the first transistor, and in which the gate of the fourth transistor receives a second input voltage signal from the drain of the second transistor., It is an object of the present invention to provide a differential current mirror with good common mode rejection of current signals.

It is another object of the present invention to provide a common mode rejection differential current mirror that provides good power supply rejection at the output.

It is still another object of the present invention to provide a common mode rejection differential current mirror with a mirroring ratio that is independent of process-voltage-temperature (PVT) variations in the electronic components of the system.

It is yet another object of the present invention to provide a common mode rejection differential current mirror that can operate at low voltages.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OR THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged differential current mirror.

Figure 1:
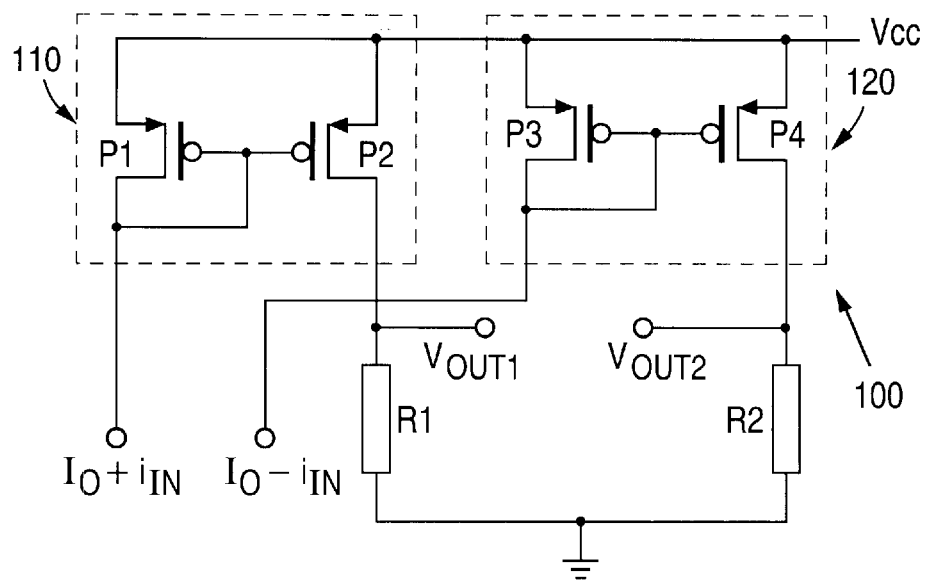
FIG. 1 illustrates a prior art differential current mirror.

FIG. 1 illustrates a prior art differential current mirror 100. Differential current mirror 100 comprises first current mirror 110 and second current mirror 120. First current mirror 110 comprises two metal oxide semiconductor field effect transistors, P1 and P2, coupled together in a current mirror configuration. Similarly, second current mirror 120 comprises two metal oxide semiconductor field effect transistors, P3 and P4, coupled together in a current mirror configuration.

Current $I_o+i_{IN}$ is input to transistor P1 of current mirror 110 and current $I_o-i_{IN}$ is input to transistor P3 of current mirror 120. The current $I_o$ represents a DC bias current and $i_{IN}$ represents an AC signal current. The differential output voltage is measured between the terminals $V_{OUT1}$ and $V_{OUT2}$.

The difference between two current input signals, $i_1$ and $i_2$, is called the differential mode of the two current input signals and is defined as:

$$I_{dm} = i_1 - i_2 \quad (1)$$

The average value of two current input signals, $i_1$ and $i_2$, is called the common mode of the two current input signals and is defined as:

$$I_{cm} = \frac{1}{2}(i_1 + i_2) \quad (2)$$

Input signals that are neither purely differential mode input signals nor purely common mode input signals can be expressed as linear combinations of the differential mode signal components and the common mode signal components. When input signals are provided to the two inputs of a differential amplifier (not shown in FIG. 1), the differential amplifier will respond to the differential mode component with a differential mode gain and will respond to the common mode component with a common mode gain. This superposition is valid when the differential amplifier's response is linear.

It is often desirable to amplify the differential mode component of two input signals by a large gain factor while minimizing the amplification factor of the common mode component. Minimization of the amplification factor of the common mode component is referred to as "rejecting" the common mode of the input signals. A measurement of the amount of rejection of the common mode is a figure of merit called the common mode rejection ratio (CMRR). The CMRR is defined as the ratio of the magnitude of the differential mode gain to the magnitude of the common mode gain. The definition is:

$$CMRR = \frac{|\text{differential mode gain}|}{|\text{common mode gain}|} \quad (3)$$

The CMRR is often measured in decibels, so that an alternate definition is:

$$CMRR = 20 \log_{10} \frac{|\text{differential mode gain}|}{|\text{common mode gain}|} \quad (4)$$

If the width (W) and the length (L) of the gates in transistor P1 and transistor P2 in current mirror 110 is equal to the width (W) and the length (L) of the gates in transistor P3 and transistor P4 in current mirror 120, then current mirror 110 and current mirror 120 each have a current gain equal to one.

A current gain of one for current mirror 110 and current mirror 120 means that (1) the differential mode of the two input current signals, $I_o+i_{IN}$ and $I_o-i_{IN}$, also has a gain equal to one, and (2) the common mode of the two input current signals, $I_o+i_{IN}$ and $I_o-i_{IN}$, also has a gain equal to one.

Because the common mode signals have a gain equal to one (i.e., there is no reduction in the amplitude of the signal), there is no rejection of the common mode signals. Because the differential mode signals also have a gain equal to one, the differential mode gain is equal to the common mode gain. This means that the value of CMRR is also equal to one. In decibels, the value of CMRR is zero (0) decibels because log 10 (1) is zero.

It is possible to achieve current gains other than one by varying the ratio of width to length (W/L) of transistor P2 to transistor P1 (and of transistor P3 to transistor P4). But the current gains achieved in this way are again the same for both the differential mode signals and the common mode signals. Prior art differential current mirrors of this type are not able to provide rejection of the common mode components of two input signals.

In order to overcome these deficiencies in the prior art, the present invention provides a differential current mirror than can replicate (or "mirror") the differential mode components of two input signals while rejecting the common mode components of the two input signals. As will be more fully explained, the present invention utilizes the differential transconductance of a differential amplifier pair to achieve this result.

Figure 2:
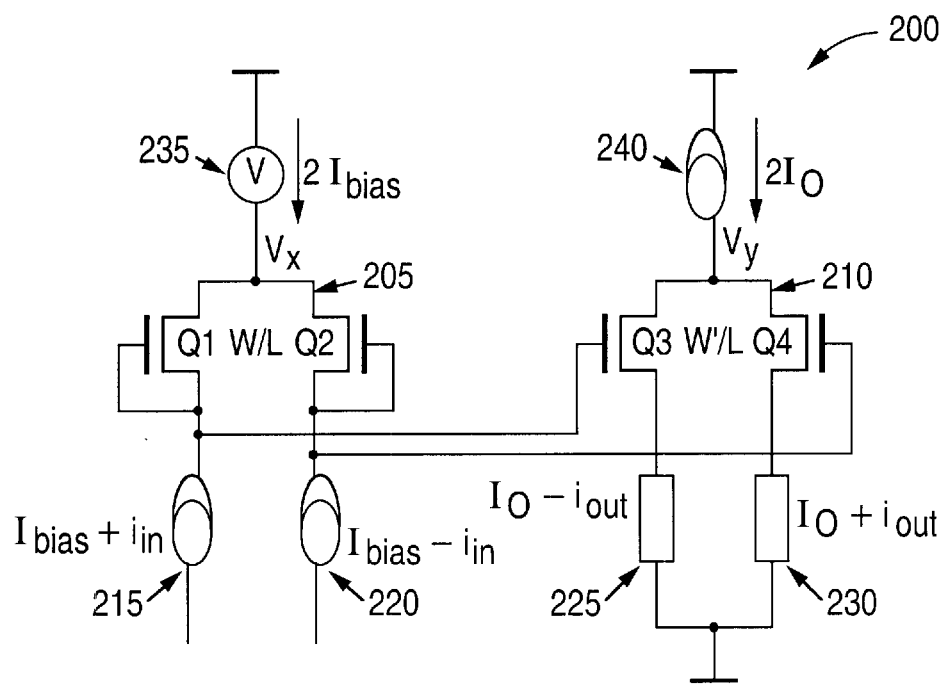
FIG. 2 illustrates an exemplary differential current mirror according to one embodiment of the present invention.

FIG. 2 illustrates exemplary differential current mirror 200 according to one embodiment of the present invention. Differential current mirror 200 comprises a pair of diode connected transistors 205 coupled to a differential amplifier 210. The pair of diode connected transistors 205 comprises two metal oxide semiconductor field effect transistors (MOSFETs), Q1 and Q2, coupled together. The width (W) to length (L) ratio of the gates in transistors, Q1 and Q2, is indicated by the expression (W/L).

Similarly, differential amplifier 210 comprises two MOSFETs, Q3 and Q4, coupled together in a differential amplifier configuration. The width (W') to length (L) ratio of the gates in transistors, Q3 and Q4, is indicated by the expression (W'/L). It is seen that the length (L) of the gates in the pair of diode connected transistors 205 and the length (L) of the gates in differential amplifier 210 are the same. However, the width (W) of the gates in the pair of diode connected transistors 205 is not equal to the width (W') of the gates in differential amplifier 210.

The bias current, $I_D$, through a MOSFET in the constant current region is given by:

$$I_D = K(V_{GS} - V_{TR})^2 \quad (5)$$

where K equals the conductance parameter of the transistor, $V_{GS}$ is the gate to source voltage, and $V_{TR}$ is the threshold voltage of the transistor. The conductance parameter, K, of a MOSFET transistor may be expressed in the form:

$$K = \tfrac{1}{2}\mu C_{OX}(W/L) \quad (6)$$

where $\mu$ is a material dependent parameter called the carrier mobility, and where $C_{OX}$ is the gate to substrate capacitance per unit area (measured in picofarads per square micrometer), and where W is the width of the gate (measured in micrometers), and where L is the length of the gate (measured in micrometers). The conductance parameter, K, is measured in milliamps per volts squared.

The transconductance parameter, $g_m$, is defined to be the partial derivative of the drain current (i.e., the bias current plus the signal current) with respect to the gate to source voltage. The partial derivative is evaluated at the bias point where the bias current is $I_D$ and the gate to source voltage is $V_{GS}$. If the transistor is biased in the constant current region, then the transconductance parameter, $g_m$, may be expressed in the form:

$$g_m = 2[KI_D]^{1/2} \quad (7)$$

The transconductance parameter, $g_m$, is a conductance that is measured in units of siemens (or, equivalently, mhos). Using the expression for K from equation (6) the transconductance parameter, $g_m$, may be expressed in the form:

$$g_m = [2I_D \mu C_{OX}(W/L)]^{1/2} \quad (8)$$

In FIG. 2, current source 215 provides a current that is equal to $I_{bias} + i_{IN}$. Current source 215 is coupled to the drain and to the gate of transistor Q1 in the pair of diode connected transistors 205. Current source 215 is also coupled to the gate of transistor Q3 in differential amplifier 210. Current source 220 provides a current that is equal to $I_{bias} - i_{IN}$. Current source 220 is coupled to the drain and to the gate of transistor Q2 in the pair of diode connected transistors 205. Current source 220 is also coupled to the gate of transistor Q4 in differential amplifier 210.

Load 225 is coupled to the drain of transistor Q3 in differential amplifier 210. The current that flows through load 225 is equal to $I_O - i_{OUT}$. Load 230 is coupled to the drain of transistor Q4 in differential amplifier 210. The current that flows through load 230 is equal to $I_O + i_{OUT}$.

Voltage source 235 is coupled to the source of transistor Q1 and to the source of transistor Q2 in the pair of diode connected transistors 205. Voltage source 235 provides a current that is equal to $2I_{bias}$.

Current source 240 is coupled to the source of transistor Q3 and to the source of transistor Q4 in differential amplifier 210. Current source 240 provides a current that is equal to $2I_O$.

In the pair of diode connected transistors 205, the transconductance parameter of transistor Q2, $g_m(1)$, and the transconductance parameter of transistor Q2, $g_m(2)$, are both given by the same expression:

$$g_m(1) = g_m(2) = [2I_{bias}\mu C_{OX}(W/L)]^{1/2} \quad (9)$$

$I_{bias}$ is the bias current for transistor Q1. $I_{bias}$ is also the bias current for transistor Q2. The differential mode transconductance parameter $g_m(1,2)$ for the pair of diode connected transistors 205 equals the transconductance parameter for transistor Q1 and for transistor Q2.

$$g_m(1,2) = g_m(1) = g_m(2) \quad (10)$$

In differential amplifier 210, the transconductance parameter of transistor Q3, $g_m(3)$, and the transconductance parameter of transistor Q4, $g_m(4)$, are both given by the same expression:

$$g_m(3) = g_m(4) = [2I_O \mu C_{OX}(W'/L)]^{1/2} \quad (11)$$

$I_O$ is the bias current for transistor Q3. $I_O$ is also the bias current for transistor Q4. Note that in the case of transistor Q3 and transistor Q4 the width W' is used instead of the width W. The differential mode transconductance parameter $g_m(3,4)$ for differential amplifier 210 equals the transconductance parameter for transistor Q3 and for transistor Q4.

$$g_m(3,4) = g_m(3) = g_m(4) \quad (12)$$

The relationship between the input signal current $i_{IN}$ and the output signal current $i_{OUT}$ is given by:

$$i_{OUT} = i_{IN}(g_m(3,4)/g_m(1,2)) \quad (13)$$

Utilizing equations (9), (10), (11) and (12), the result of equation (13) may also be expressed as:

$$i_{OUT} = i_{IN}(\sqrt{I_{OW'}}/\sqrt{I_{biasW}}) \quad (14)$$

The output currents of differential amplifier 210 are $I_O - i_{OUT}$ and $I_O + i_{OUT}$. The output currents provide a differential mirroring of the input currents while rejecting the common mode signal.

The term (W/L) is the width to length ratio of each of the gates of transistor Q1 and transistor Q2. The term (W'/L) is the width to length ratio of each of the gates of transistor Q3 and transistor Q4.

The transconductance parameter $g_r(3,4)$ is the differential mode transconductance of differential amplifier 210. One can also define its common mode transconductance as the partial derivative of the common mode output current (Id3+Id4)/2 with respect to the common mode input voltage (Vg3+Vg4)/2. The common mode transconductance of differential amplifier 210 is equal to its differential mode transconductance divided by the factor:

$$[(r_o/2) + (1/g_m(3))]g_m(3) \quad (15)$$

where $r_o$ is the output resistance of current source 240. Since the common mode rejection ratio (CMRR) of differential amplifier 210 is equal to its common mode transconductance divided by its differential mode transconductance, the same factor is equal to the CMRR. The reason that CMRR is normally very high for a differential pair is that the output resistance of a device configured as a current source is usually much greater than a transistor's transconductance, making this factor much greater than unity. In CMOS this CMRR may range from 30 dB to 60 dB, largely dependent on the configuration of the current source, such as single transistor or cascode.

The analysis set forth above relates to the direct current case. At higher frequencies the capacitances at the source of transistor Q3 and transistor Q4 will cause the value of the common mode rejection ratio (CMRR) to be degraded. Capacitance admittance is equal to two pi ($2\pi$) times the frequency times the capacitance. As long as the capacitance admittance is much less than $g_m(3)$, then the CMRR will still be much greater than unity.

Figure 3:
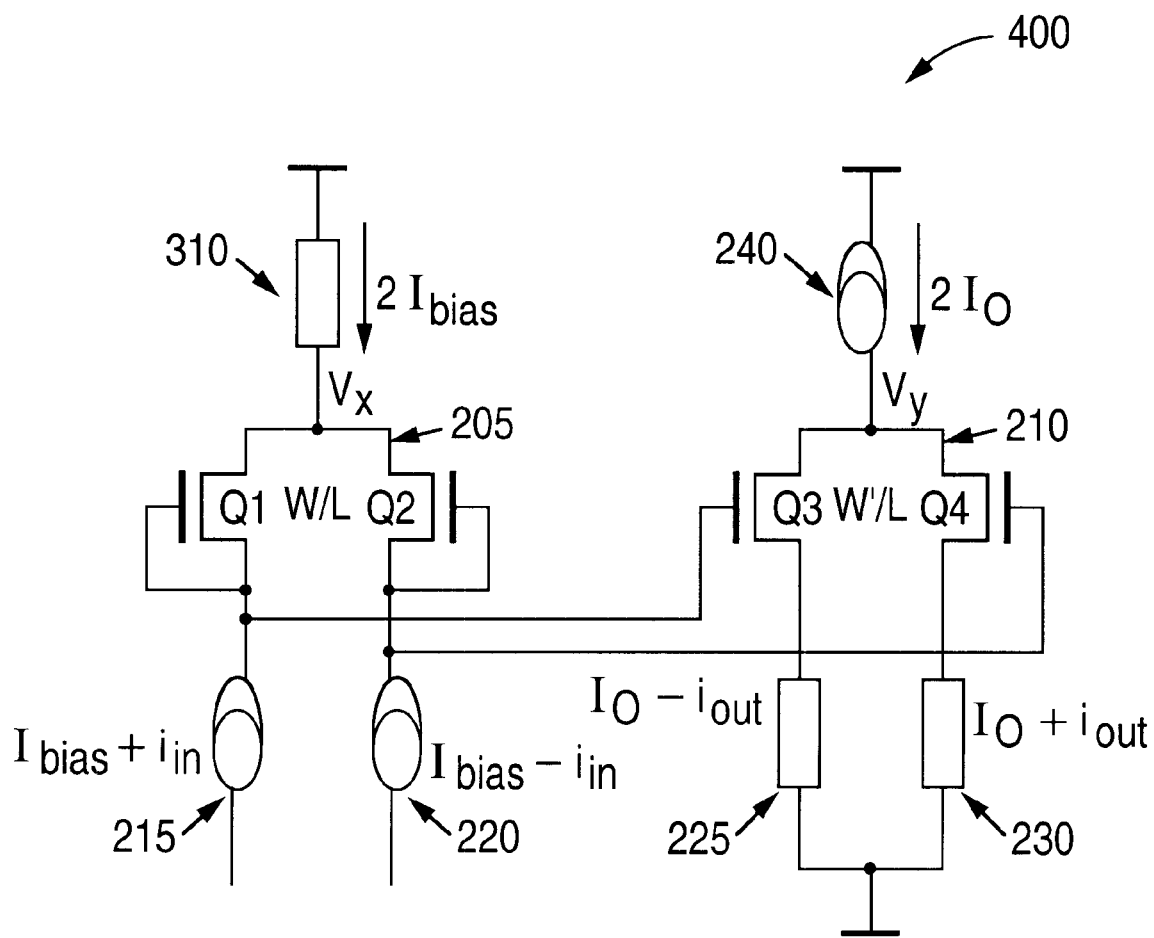
FIG. 3 illustrates an exemplary differential current mirror according to an alternate embodiment of the present invention.

FIG. 3 illustrates an exemplary differential current mirror 300 according to alternate embodiment of the present invention. In differential current mirror 300 load 310 is coupled to the pair of diode connected transistors 205. The most common form of load 310 is a resistor. The circuit parameters of load 310 are chosen so that the current through load 310 is equal to $2I_{bias}$. The operation of differential current mirror 300 is the same as that previously described for differential current mirror 200.

Figure 4:
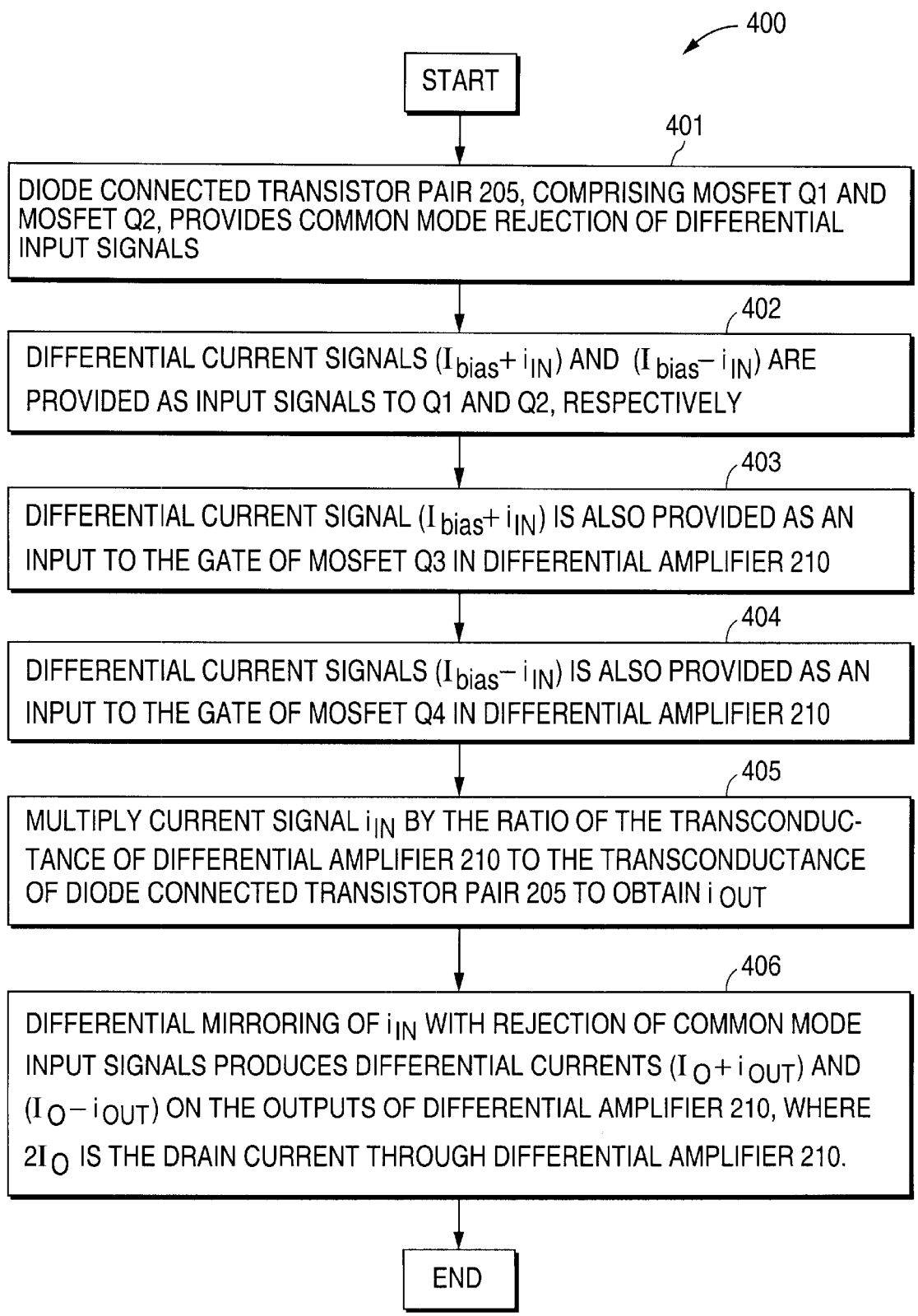
FIG. 4 is a flow diagram describing the logic of the operation of an exemplary differential current mirror according to one embodiment of the present invention.

FIG. 4 is a flow diagram describing the logic of the operation of one exemplary embodiment of the differential current mirror of the present invention. In operation step 401 MOSFET transistor Q1 and MOSFET transistor Q2 are coupled together in the pair of diode connected transistors 205. In operation step 402 a differential current signal $I_{bias}+i_{IN}$ is provided to transistor Q1 and a differential current signal $I_{bias}-i_{IN}$ is provided to transistor Q2. In operation step 403 the differential current signal $I_{bias}+i_{IN}$ is provided to the gate of MOSFET transistor Q3 of differential amplifier 210. In operation step 404 the differential current signal $I_{bias}-i_{IN}$ is provided to the gate of MOSFET transistor Q3 of differential amplifier 210.

In operation step 405 the current signal $i_{OUT}$ is calculated by multiplying the current signal $i_{IN}$ by the ratio of the transconductance of differential amplifier 210 to the transconductance of the pair of diode connected transistors 205. In operation step 406 the differential output currents $I_O+i_{OUT}$ and $I_O-i_{OUT}$ are obtained from the outputs of differential amplifier 210. These differential output currents represent a differential mirroring of the input currents with rejection of the common mode signal.

The present invention provides several advantages over the prior art. The present invention provides good common mode rejection of current signals. In addition, the present invention provides good power supply rejection at the output. The mirroring ratio is independent of process-voltage-temperature (PVT) variations. Lastly, the present invention provides a good low voltage solution to task of mirroring differential current signals with common mode rejection of current signals.

Although the present invention has been described in detail, those skilled in the art should understand that they can make various changes, substitutions and alterations herein without departing from the spirit and scope of the invention in its broadest form.

What is claimed is:

1. A differential current mirror capable of rejecting common mode input current signals, said differential current mirror comprising:
   a pair of diode connected transistors comprising a first transistor and a second transistor coupled together in a common mode rejection configuration;
   a differential amplifier coupled to said pair of diode connected transistors, said differential amplifier comprising a third transistor and a fourth transistor coupled together, wherein a gate of said third transistor is coupled to the drain of said first transistor, and wherein a gate of said fourth transistor is coupled to the drain of said second transistor;
   a first input current source that provides a first input signal to a drain of said first transistor and to said gate of said third transistor, wherein said first input signal comprises a direct current bias current plus an alternating current input signal current, and
   a second input current source that provides a second input signal to a drain of said second transistor and to the gate of said fourth transistor, wherein said second input signal comprises a direct current bias current minus an alternating current input signal current;
   wherein said differential current mirror is capable of multiplying said alternating current input signal current by the ratio of the transconductance of said differential amplifier to the transconductance of said pair of diode connected transistors to obtain an alternating current output signal current; and
   wherein said differential current mirror rejects common mode current signals with a common mode rejection ratio that is equal to:

$$[(r_o/2)+(1/g_m(3))]g_m(3)$$

where $r_o$ equals the output resistance/of a current source of said differential amplifier, and $g_m(3)$ equals the transconductance of said third transistor.

2. A differential current mirror as claimed in claim 1 wherein said differential current mirror is capable of providing power supply rejection at the output of said differential current mirror.

3. A differential current mirror as claimed in claim 1 wherein said differential current mirror is capable of providing a mirroring ratio that is independent of process-voltage-temperature variations.

4. A differential current mirror as claimed in claim 1 wherein said differential current mirror is capable of operating at low voltages.

5. A differential current mirror for providing differential output current signals that are proportional to differential input current signals in which common mode current signals are rejected comprising:
   a pair of diode connected transistors comprising a first transistor and a second transistor coupled together in a common mode rejection configuration; and
   a differential amplified coupled to said pair of diode connected transistors, said differential amplifier comprising a third transistor and a fourth transistor in which a gate of said third transistor receives a first input signal from the drain of said first transistor, and in which a gate of said fourth transistor receives a second input signal from the drain of said second transistor;
   wherein said differential current mirror rejects common mode current signals with a common mode rejection ratio that is equal to:

$$[(r_o/2)+(1/g_m(3))]g_m(3)$$

where $r_o$ equals the output resistance of a current source of said differential amplifier, and $g_m(3)$ equals the transconductance of said third transistor.

6. For use in a differential current mirror, a method for providing differential output current signals that are proportional to differential input current signals in which common mode current signals are rejected, said method comprising the steps of:
   coupling together a first transistor and a second transistor to form a pair of diode connected transistors in a common mode rejection configuration;
   coupling a differential amplifier to said pair of diode connected transistors, wherein said differential amplifier comprises a third transistor and a fourth transistor in which a gate of said third transistor is coupled to the drain of said first transistor, and in which a gate of said fourth transistor is coupled to the drain of said second transistor;

providing to the drain of said first transistor and to the gate of said third transistor an input signal that is equal to a direct current bias current plus an alternating current input signal current;

providing to the drain of said second transistor and to the gate of said fourth transistor an input signal that is equal to a direct current bias current minus an alternating current input signal current;

multiplying said alternating current input signal current by the ratio of the transconductance of said differential amplifier to the transconductance of said pair of diode connected transistors to obtain an alternating current output signal current; and rejecting common mode current signals in said differential current mirror with a common mode rejection ratio that is equal to:

$$[(r_o/2)+(1/g_m(3))]g_m(3)$$

where $r_o$ equals the output resistance of a current source of said differential amplifier, and $g_m(3)$ equals the transconductance of said third transistor.

7. The method as set forth in claim 6 further comprising the step of:

providing power supply rejection at the output of said differential current mirror.

8. The method as set forth in claim 6 further comprising the step of:

providing a mirroring ratio that is independent of process-voltage-temperature variations.

9. The method as set forth in claim 6 further comprising the step of:

operating said differential current mirror at low voltages.

* * * * *

UNITED STATES PATENT AND TRADEMARK OFFICE
CERTIFICATE OF CORRECTION

PATENT NO. : 6,407,637 B1
DATED : June 18, 2002
INVENTOR(S) : Abhijit M. Phanse and Michael X. Maida It is certified that error appears in the above-identified patent and that said Letters Patent is hereby corrected as shown below:

Column 5,
Line 64, delete "Q2" and insert -- Q1--;

Column 6,
Line 41, delete "g" and insert -- $g_m$ --;

Column 8,
Line 17, delete "/" after the word "resistance".

Signed and Sealed this

Fifteenth Day of November, 2005

JON W. DUDAS
*Director of the United States Patent and Trademark Office*